United States Patent [19]

Bayless et al.

[11] Patent Number: 4,699,869

[45] Date of Patent: Oct. 13, 1987

[54] PROCESS FOR THE PREPARATION OF A DISTORTION RESISTANT POLYESTER SUPPORT FOR USE AS A PHOTOTOOL

[75] Inventors: John H. Bayless, Hendersonville, N.C.; Neil I. Steinberg, Greer, S.C.; James H. Thirtle, Rochester, N.Y.

[73] Assignee: E. I. Du Pont de Nemours and Company, Wilmington, Del.

[21] Appl. No.: 928,153

[22] Filed: Nov. 7, 1986

Related U.S. Application Data

[62] Division of Ser. No. 813,969, Dec. 27, 1985, Pat. No. 4,645,731.

[51] Int. Cl.$^4$ .................................................. G03C 1/76
[52] U.S. Cl. .................................... 430/271; 427/402; 430/534; 430/535
[58] Field of Search ................. 427/402; 430/271, 534, 430/535

[56] References Cited

U.S. PATENT DOCUMENTS

| | | | |
|---|---|---|---|
| 3,271,178 | 9/1966 | Nadeau et al. | 117/7 |
| 3,434,840 | 3/1969 | DeKeyser et al. | 96/87 |
| 4,002,802 | 1/1977 | Bayless et al. | 428/483 |
| 4,196,001 | 4/1980 | Joseph et al. | 430/502 |
| 4,254,210 | 3/1981 | Van Stappen | 430/285 |
| 4,287,298 | 9/1981 | Dodwell | 430/533 |
| 4,407,938 | 10/1983 | Mizukura et al. | 430/533 |

OTHER PUBLICATIONS

A Coordinatograph–Glass Grid Method For Measuring Dimensional Changes in Films, Kenneth M. Smith, Journal of Applied Photographic Engineering, vol. 1, Fall 1975, pp. 12 to 17.

The Dimensional Stability of Polyester Photographic Films, Kenneth M. Smith, copyright 1979 by E. I. du Pont de Nemours and Company.

Primary Examiner—Jack P. Brammer

[57] ABSTRACT

Photosensitive element comprisng a polyester, e.g., polyethylene terephthalate, at least 0.008 inch (0.20 mm) thick bearing on both sides a polymeric water-vapor barrier layer at least 0.00001 inch (0.00025 mm) thick of a copolymer of vinylidene chloride containing at least 80% by weight of vinylidene chloride and minor amounts of alkyl acrylate, and itaconic acid, and on at least one side of said barrier layer, a layer of a photosenstive material, e.g., silver halide emulsion, diazo or photopolymer. The element in the form of a phototool limits dimensional change within 6 hours after exposure to a 5% Relative Humidity change to no more than 0.001 inch (0.025 mm) per 24 inches (60.96 cm).

10 Claims, 2 Drawing Figures

4,699,869

PROCESS FOR THE PREPARATION OF A DISTORTION RESISTANT POLYESTER SUPPORT FOR USE AS A PHOTOTOOL

This is a division of application Ser. No. 813,969, filed Dec. 27, 1985, now U.S. Pat. No. 4,645,731.

TECHNICAL FIELD

This invention relates to an improved dimensionally stable photosensitive element. More particularly this invention relates to an improved dimensionally stable photosensitive element comprising a polyester support at least 0.008 inch in thickness bearing a saran type water-vapor barrier layer.

BACKGROUND ART

Photosensitive elements are extremely useful in the preparation of printing plates such as relief or lithographic plates, photoresists, etc. These photosensitive elements may be photopolymer, silver halide, diazo or other types of light-sensitive materials. All require for their imagewise exposure an article referred to as a phototool, which is a copy of the image to be reproduced. Generally the phototool is a flexible photographic element which is cheap and easy to produce. The photographic element accurately copies the image to be reproduced. This is extremely important in printing and particularly in the preparation of photoresists used to manufacture printed circuits where tolerances are extremely critical. During the preparation of a printed circuit, for example, the photoresist is imagewise exposed to actinic radiation through the phototool. Not only is heat generated but the relative humidity of the room where the exposure is taking place may change radically. It is absolutely imperative to insure accurate registration during the exposure step or steps, since the phototool is normally reused many times over the period of a day. It is imperative that the photosensitive element phototool maintain a constant size with distortion limited to 0.001 inch (0.025 mm) or less over 24 inches (60.96 cm) with a ±5% change in Relative Humidity. In order to maintain the distortion level below the established limit especially when using conventional silver halide photographic film elements, it is necessary to accurately control the humidity since these elements absorb moisture from the air and within a short period of time, e.g., 1 to 2 hours or less, can exceed this established distortion limit.

There is a need for a photosensitive element which limits dimensional change to no more than 0.001 inch (0.025 mm) per 24 inches (60.96 cm) within six hours after exposure to a ±5% Relative Humidity change.

BRIEF DESCRIPTION OF THE DRAWING

In the accompanying Figures forming a material part of the disclosure wherein the Figures are a schematic view in cross section of a photographic element.

DISCLOSURE OF THE INVENTION

Figure 1:
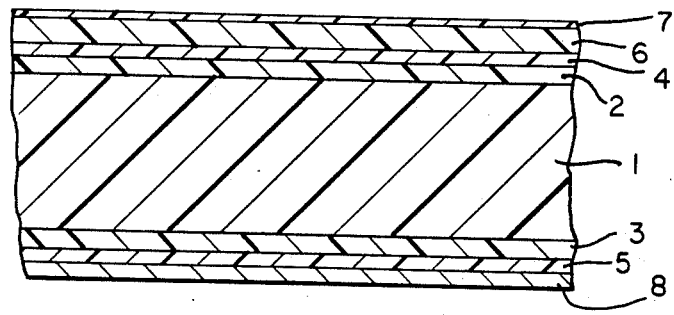
FIG. 1 illustrates a prior art photographic element wherein support (1) is a polyester support, e.g., polyethylene terephthalate no more than 0.007 inch (0.18 mm) thick, layers (2) and (3) are conventional resin sublayers which are generally applied to the support prior to biaxial orientation, layers (4) and (5) are gel subbing layers, layer (6) is a gelatino-silver halide emulsion layer, layer (7) is a gelatin antiabrasion layer and layer (8) is a backing layer, e.g., gelatin layer which may contain antihalation compounds, etc.

In accordance with this invention there is provided a photosensitive element which limits dimensional change to no more than 0.001 inch (0.025 mm) per 24 inches (60.96 cm) within six hours after exposure to a 5% Relative Humidity change comprising a biaxially oriented polyester support of at least 0.008 inch (0.20 mm) in thickness bearing on both sides thereof a polymeric water-vapor barrier layer at least 0.00001 inch (0.00025 mm) thick of a copolymer of vinylidene chloride containing at least 80% by weight of vinylidene chloride and minor amounts of an alkyl acrylate wherein alkyl is 1 to 4 carbon atoms, and itaconic acid to which subsequently coated layers adhere, and on at least one side of said water-vapor barrier layer, a layer of a photosensitive material.

This invention is directed to an improved photosensitive element which, as noted above, limits dimensional change thereof to no more than 0.001 inch (0.025 mm) per 24 inches (60.96 cm) within six hours after exposure to a ±5% change in Relative Humidity. Photosensitive elements of this invention can limit the described dimensional change for up to about 42 hours. The dimensional change of a photosensitive element is determined by the typical procedures described in articles entitled "Dimensional Stability Measurement of Photographic Film" by Richard J. Byer, Journal of Applied Photographic Engineering, Volume 9, No. 5, October 1983, pages 135 to 138; and "A Coordinatograph-Glass Grid Method for Measuring Dimensional Changes in Films" by Kenneth M. Smith, Journal of Applied Photographic Engineering, Volume 1, Fall 1975, pages 12 to 17.

To achieve the improvement for dimensional change of the photosensitive element, it has been found that a polyester support of a thickness greater than the standard film base is required. The polyester support is at least 0.008 inch (0.20 mm) in thickness. The upper thickness limit of the support is dictated by the use. Generally when the photosensitive element is used as a phototool a useful thickness range is from 0.008 inch (0.20 mm) to 0.015 inch (0.38 mm). Useful supports are the polyesters which are cast as films, biaxially stretched, heatset, and heat relaxed to achieve dimensional stability. The films formed from the polyesterification product of a dicarboxylic acid and a dihydric alcohol according to the teachings of Alles, U.S. Pat. No. 2,779,684 and the patents cited in that specification are particularly useful. Other suitable supports include the polyethylene terephthalate/isophthalate of British Pat. No. 766,290 and Canadian Pat. No. 562,672 and those obtained by condensing terephthalic acid or dimethyl terephthalate with propylene glycol, diethylene glycol, tetramethylene glycol or cyclohexane 1,4-dimethanol (hexahydro-p-xylene alcohol). The films of Bauer et al.

U.S. Pat. No. 3,052,543, Sept. 4, 1962 may also be used. These polyester films are particularly suitable because of their dimensional stability. Polyethylene terephthalate is the preferred support. Such polyesters contain repeating units of the structure

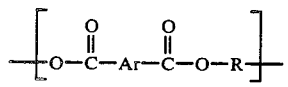

wherein R is an alkylene group of from 2 to 10 carbon atoms, a cycloalkylene group of from 6 to 10 carbon atoms, or an arylene group of from 6 to 20 carbon atoms; and Ar is either phenylene or naphthylene. Preferred alkylene groups are ethylene and n-butylene 1,4. The preferred cycloalkylene group is

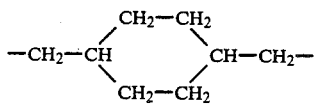

The preferred aromatic group is

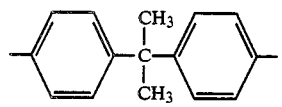

Preferred Ar groups are phenylene-1,4; phenylene-1,3; and naphthalene-2,6. Generally the polyester will be biaxially oriented by stretching from 1.5 to 5X in both the machine direction and in the transverse direction. Various stretching temperatures may be used, but for polyethylene terephthalate 75°–150° C. is particularly satisfactory. Heat setting and heat relaxing are used to improve the dimensional stability of the film. The above patents are incorporated herein by reference.

Onto both sides of the above-described support is applied a layer of at least 0.00001 inch (0.00025 mm) thick of a saran type polymeric water-vapor barrier layer. It has been found that the presence of such water-vapor barrier layers on the relatively thick polyester film enable the dimensional stability advantage of the invention to be achieved. Moisture barrier coatings do not affect steady state humidity expansion, and an increase in support thickness from 0.007 inch (0.18 mm) to 0.0085 inch (0.22 mm), for example, would decrease film expansion with the humidity change by only 20%. As illustrated in Example 1 below, it is surprising that the combination of the thicker polyester film and water-vapor barrier layer provides this degree of improvement against dimensional change. Suitable polymers for the water-vapor barrier layer include: a copolymer of vinylidene chloride containing at least 80% by weight of vinylidene chloride and minor amounts of alkyl acrylate wherein alkyl is of 1 to 4 carbon atoms, and itaconic acid. Weight percentage amounts of preferred copolymer components, for example, are vinylidene chloride, 80 to 98; alkyl acrylate, 1 to 19; and itaconic acid, 1 to 5. A preferred saran composition is vinylidene chloride (92.6%)/methyl acrylate (5.4%)/itaconic acid (2.0%).

A photosensitive layer is present on at least one side of the water-vapor barrier layer. A photographic silver halide emulsion layer as a photosensitive layer is preferred. When a photographic element is used as a phototool, the element is not limited to a type of silver halide emulsion. The photographic element, however, preferably contains a photographic emulsion particularly suited to produce printed circuits as known to those skilled in the art.

Figure 2:
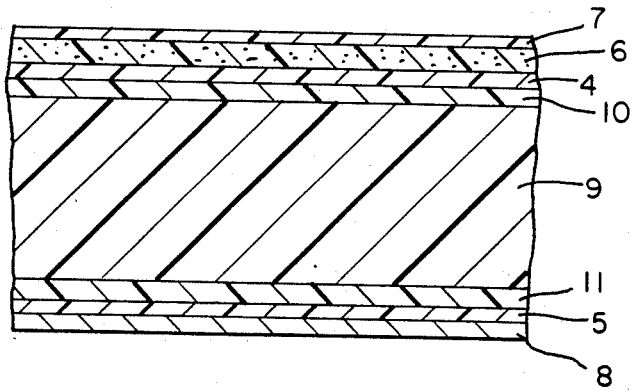
FIG. 2 illustrates a photographic element of the invention wherein support (9) is a polyester support having a thickness of at least 0.008 inch (0.20 mm), layers (10) and (11) are saran type polymeric water-vapor barrier layer at least 0.00001 inch (0.00025 mm) thick of a copolymer of vinylidene chloride containing at least 80% by weight of vinylidene chloride and minor amounts of alkyl acrylate, and itaconic acid to which subsequently coated layers adhere. Layers (4) and (5), (6), (7) and (8) are gel subbing layers, gelatino-silver halide emulsion layer, gelatin antiabrasion layer, gelatin backing layer, respectively, and are similar to those described above in FIG. 1 having identical numbers.

While the photosensitive layer can be coated directly on the water-vapor barrier layer because the adhesive properties of the barrier layer described are adequate, a thin gelatin subbing layer can be present between the barrier layer and the photosensitive layer. In FIG. 2, layers 4 and 5 denote such gelatin subbing layers while layer 6 illustrates a gelatino silver halide layer. Gelatin antiabrasion layers, e.g., containing hardened gelatin, denoted by layer 7 in FIG. 2, are generally present over such a photographic emulsion layer. On the backside of the film, as shown in FIG. 2, a gelatin backing layer 8 can be present. Such backing layers contain antihalation dyes, slip agents, etc. The subbing, antiabrasion and backing layers are standard layers in photographic elements and are well known to those skilled in the art. Depending on the particular use the configuration of the photographic element can vary. For example, gelatine silver halide emulsion layers may be present on both sides of the support either directly present on a barrier layer or a gelatin subbing layer present on the barrier layer. Preferably, a single gelatino silver halide emulsion layer is present when the photosensitive element is used to prepare a phototool.

The photosensitive elements of this invention can be prepared by the following processes. Process 1 comprises coating the polyester support with an aqueous emulsion or solvent solution of the saran polymer and subsequently drying the coating to provide a water-vapor barrier layer of the required thickness. Optionally the dry gelatin subbing layer or layers can be applied by coating and drying the layer(s). A gelatino silver halide emulsion layer is coated onto dry subbing layer, if present, or directly on suitably treated dry water-vapor barrier layer, e.g., electrostatic, flame treatment, etc. as known to those skilled in the art. A backing layer and/or an antiabrasion layer can be coated and dried in similar manner. The coatings can be accomplished by means known to those skilled in the art, e.g., roll coating, cascade coating, etc.

Preparation Process 2 comprises coating the polyester support with an aqueous emulsion of the saran polymer treated with an anionic exchange resin as described in Bayless and Arvidson U.S. Pat. No. 4,002,802, which is incorporated herein by reference. Example 3 below describes a procedure wherein an ion exchange resin treatment is used whereby a relatively thick water-vapor barrier layer is coated on the support. After drying the water-vapor barrier layers, the optional subbing and backing layers can be coated over the barrier layer and dried. At least one photographic silver halide emulsion is coated and dried as described above. Similarly an antiabrasion layer can be present. A preferred mode of the invention is described in Example 1, Sample D(2).

INDUSTRIAL APPLICABILITY

The photosensitive element of this invention is useful as a phototool in exposing photosensitive elements used to prepare printing plates, proofs, resists, etc. The photosensitive elements are particularly useful since they provide superior resistance to dimensional change exceeding the minimum requirement of no more than 0.001 inch (0.025 mm) per 24 inches (60.96 cm) within six hours after exposure to a 5% Relative Humidity change. The photosensitive elements are easy to prepare. When silver halide is used, for example, the photographic element is exposed to a master, developed, fixed, washed and dried. In addition, the photosensitive layer may be photopolymer, photocrosslinkable, diazo, etc. as known to those skilled in the art.

EXAMPLES

The following examples wherein the parts and percentages are by weight illustrate but do not limit the invention.

EXAMPLE 1

A. CONTROL (Prior Art)

A photographic film support made according to the prior art was used for this control. This support comprised 0.007 inch (0.18 mm) polyethylene terephthalate film on which a conventional resin sub was coated on both sides thereof prior to biaxially stretching the film to achieve dimensional stability. This conventional resin sub comprises a sequentially polymerized mixture of:

(a) 75% of vinylidene chloride ($VCl_2$)/methyl acrylate (MA)/itaconic acid (IA) terpolymer in the respective parts of 85/15/2, and, (b) 25% of a polymer of ethyl acrylate (EA) formed by addition polymerization in the presence of the terpolymer (a) (see Rawlins, U.S. Pat. No. 3,443,950). After coating the resin layer, the film was biaxially stretched and heat set. A thin, hardened gelatin layer was applied on each side over the resin layer and heat relaxed as known to those skilled in the art.

B. CONTROL (Thick Support)

A photographic film support made according to A, described above, but at 0.0085 inch (~0.22 mm) thickness.

C. CONTROL (With Barrier Layer)

A photographic film support was made as described in A, above, but having a 0.000022 inch (0.00056 mm) moisture barrier layer coated on both sides between the hardened gel layer and the polyester support. This moisture barrier layer comprises a saran with a composition of 92.6% $VCl_2$, 5.4% MA and 2.0% IA.

D. THE INVENTION

Two samples of 0.0085 inch (~0.22 mm) film base (see B, above) were prepared. Film 1 was coated with a 0.000022 inch (0.00056 mm) moisture barrier layer (see C, above) on both sides; Film 2 was coated with a 0.0001 inch (0.0025 mm) thick barrier layer applied as two separate coatings in order to achieve the desired thickness.

Each of the above prepared samples were coated with silver halide photographic emulsions and checked for sensitometric and coating properties. All were satisfactory and could be used to prepare a phototool as described in this specification. Each sample was also measured for the time required for a 24 inch (60.96 cm) sample to expand 0.001 inch (0.025 mm) (following exposure to a 5% Relative Humidity change with the following results set out in Table 1:

TABLE 1

| Sample | Description | Time (hours) |
|---|---|---|
| A | Film, 0.007 inch (0.18 mm) thick, with conventional sub (Control) | 1 |

TABLE 1-continued

| Sample | Description | Time (hours) |
|---|---|---|
| B | Film, 0.0085 inch (0.22 mm) thick, with conventional sub (Control) | 3 |
| C | Film, 0.007 inch (0.18 mm) thick, with conventional sub + 0.000022 inch (0.00056 mm) thick moisture barrier layer (Control) | 5 |
| D | Film, 0.0085 inch (0.22 mm) thick having: | |
| | (1) 0.000022 inch (0.00056 mm) moisture barrier layer | 11.5 |
| | (2) 0.0001 inch (0.0025 mm) moisture barrier layer | 42 |

As can be seen from the results shown in Table 1. Sample D, the thicker film base with a moisture barrier layer, provides a significant increase in expansion time to expand 0.001 inch (0.025 mm) over 24 inches (60.96 cm) at a 5% Relative Humidity change. The 11–42 hours is sufficient time to be useful as a phototool and is surprising due to the synergistic effect of both the thicker film support and the moisture barrier layer to achieve the desired results.

EXAMPLE 2

Samples of films A, B, C, and D(1) described in Example 1 were tested to see how much each expanded immediately following an exposure to a 5% Relative Humidity change. This expansion referred to as "the jump" is another indication of the film stability and represents much of the expansion that will occur in a film. The following results were obtained as set out in Table 2:

TABLE 2

| SAMPLE | "JUMP" (inch) |
|---|---|
| A | 0.00069 |
| B | 0.00056 |
| C | 0.00051 |
| D(1) | 0.00042 |

The results of Table 2 indicate that more than half of the 0.001 inch (0.025 mm) limit is achieved in the cases of A, B, and C within the first few seconds exposure to a 5% Relative Humidity change while less than half of the limit with D(1), a film of the invention. Thus, this is an indication that film Sample D(1) is much more stable under these conditions.

EXAMPLE 3

This example illustrates the preparation of an element according to this invention wherein the polymeric water-vapor barrier layer is relatively thick, ca. 0.0001 inch (0.0025 mm). A sample of 0.0085 inch (~0.22 mm) polyethylene terephthalate film support is made according to Example 1. A conventional resin sub (see Example 1) is applied on each side of this support and the film biaxially stretched and heat set. A saran-type formulation as described in Example 1C is then prepared and further treated by contact with an ion-exchange resin as taught in Example 1 of U.S. Pat. No. 4,002,802. The treated saran is then coated on both sides of the polyester support at a thickness of ca. 0.0001 inch (0.0025 mm). A gel sub is applied to both sides of the coated support which is then heat-relaxed at about 135° C. for about 2 minutes. The resulting film support is imminently suitable for use as a photographic element used as a phototool and more than 40 hours is required before the support expanded more than 0.001 inch (0.025 mm) over 24 inches (60.96 cm) after being exposed to a 5% Relative Humidity change. Since it is possible to apply the saran-type barrier layer to the support after biaxial orientation, as is described above, the desired thickness is then achieved by a single coating pass which commercially is a great advantage over multiple applications.

EXAMPLE 4

A sample of 0.0085 inch (18 0.22 mm) polyethylene terephthalate film is prepared and coated with moisture barrier layer, 0.0001 inch (0.0025 mm) as taught in Example 1,D(2). A UV absorber layer comprising yellow dyes and pigments dispersed in an acrylic hydrosol as described in Example I of Roos, U.S. Pat. No. 4,126,466 is coated on this support to a thickness of ca. 0.0002 inch (0.0005 mm) and dried. The photoresist layer of the Roos example (comprising trimethylolpropanetriacrylate dispersed with initiators and the like in a suitable copolymer binder) is then coated contiguous to the UV absorber layer as taught in that example. The dried, finished product is imminently suitable as a photomask when exposed and developed by solvent wash-out as taught by Roos. During this wash-out of the unexposed photoresist layer, those areas of the UV layer corresponding to these portions are also washed out leaving a yellow colored positive of the original image placed thereon. This yellow image can be subsequently used to make copies as described above. In addition, the element resists significant expansion when exposed to a 5% Relative Humidity change as also previously described. Thus, this example demonstrates the use of yet another photosensitive layer within the ambit of this invention.

EXAMPLE 5

In order to demonstrate the utility of yet another type of photosensitive layer within the teachings of this invention, the film support of Example 4 is prepared and coated with a moisture barrier layer as described therein. A UV absorber layer made as described in Example I of Roos, U.S. Pat. No. 4,126,466, is then applied to a thickness of ca. 0.0002 inch (0.005 mm) and dried. A crosslinkable isoprene resist which has been identified by Hunter et al. in Photo. Sci. and Eng., Vol. 13, No. 5, p. 271 (1969) sold by Eastman Kodak as "Kodak Thin Film Resist" is coated contiguous to the UV absorber layer at ca. 0.002 inch (0.051 mm) thickness. After drying, the element is exposed to a test image and developed in a xylene based developer furnished by the manufacturer of the resist (Eastman Kodak Co. "Metal Etch Resist Developer") by soaking 10 minutes at room temperature. The element is then rinsed in a 50/50 mixture of ethyl alcohol and water to produce an excellent copy of the original image. This yellow copy is suitable for use as a photomask and in addition requires more than 40 hours before it expanded more than 0.0001 inch (0.025 mm) over 24 inches (60.96 cm) when exposed to a 5% Relative Humidity change.

EXAMPLE 6

A film support is prepared and coated with the moisture barrier layer and UV absorber layer as described in Example 4. A crosslinkable, photosensitive composition containing a bis-diazonium salt in a macromolecular organic polymer binder as described in Roos, U.S. Pat. No. 3,778,270, Example II, is next prepared and coated on top of the dried UV absorber layer. A test image is then placed on the dried, photosensitive layer and exposed and developed as described in Example II of the Roos patent. The solvent used to wash out the exposed areas of the photosensitive composition also removed the same areas of the UV absorber layer leaving a positive image of the original which is suitable for use as a photomask for imaging subsequent copies. This element also shows the same resistance to dimensional change when exposed to a 5% Relative Humidity change as described in Example 5, above.

What is claimed is:

1. A process for the preparation of a photosensitive element which limits dimensional change to no more than 0.001 inch per 24 inches within six hours after exposure to a 5% Relative Humidity change comprising
   A. coating a polyester support at least 0.008 inch in thickness on both sides with aqueous emulsion of a polymeric water-vapor barrier layer of a copolymer of vinylidene chloride consisting essentially of 80 to 98% by weight of vinylidene chloride, 1 to 19% by weight of an alkyl acrylate wherein alkyl is 1 to 4 carbon atoms, and 1 to 5% by weight of itaconic acid.
   B. drying the polymeric water-vapor barrier layer to provide a dry thickness of at least 0.00001 inch, and
   C. coating on at least one of the dry polymeric water-vapor barrier layers a photosensitive layer.

2. A process according to claim 1 wherein the photosensitive layer is a photographic silver halide emulsion layer.

3. A process according to claim 1 wherein the photosensitive layer is a layer of a photopolymerizable composition.

4. A process according to claim 1 wherein the photosensitive layer is a layer of a photocrosslinkable composition.

5. A process according to claim 1 wherein on at least one of the dry polymeric water-vapor barrier layers a gelatin layer is coated and dried and a photosensitive layer is coated on at least one of the gelatin layers.

6. A process for the preparation of a photosensitive element which limits dimensional change to no more than 0.001 inch per 24 inches within six hours after exposure to a 5% Relative Humidity change comprising
   A. coating a polyester support at least 0.008 inch in thickness on both sides with an aqueous emulsion of a polymeric water-vapor barrier layer of a copolymer of vinylidene chloride consisting essentially of 80 to 98% by weight of vinylidene chloride, 1 to 19% by weight of an alkyl acrylate wherein alkyl is 1 to 4 carbon atoms, and 1 to 5% by weight of itaconic acid, treated with an anionic exchange resin,
   B. drying the polymeric water-vapor barrier layer to provide a dry thickness of at least 0.00001 inch, and
   C. coating on at least one of the dry polymeric water-vapor barrier layers a photosensitive layer.

7. A process according to claim 6 wherein the photosensitive layer is a photographic silver halide emulsion layer.

8. A process according to claim 6 wherein the photosensitive layer is a layer of a photopolymerizable composition.

9. A process according to claim 6 wherein the photosensitive layer is a layer of a photocrosslinkable composition.

10. A process according to claim 6 wherein on at least one of the dry polymeric water-vapor barrier layers a gelatin layer is coated and dried and a photosensitive layer is coated on at least one of the gelatin layers.

* * * * *